(12) United States Patent
Minotti et al.

(10) Patent No.: US 9,362,142 B2
(45) Date of Patent: Jun. 7, 2016

(54) FLIP-CHIP ELECTRONIC DEVICE AND PRODUCTION METHOD THEREOF

(71) Applicant: STMicroelectronics S.r.l., Agrate Brianza (IT)

(72) Inventors: Agatino Minotti, Mascalucia (IT); Maurizio Maria Ferrara, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 314 days.

(21) Appl. No.: 13/921,894

(22) Filed: Jun. 19, 2013

(65) Prior Publication Data

US 2014/0001647 A1   Jan. 2, 2014

(30) Foreign Application Priority Data

Jun. 27, 2012  (IT) .............................. MI2012A1134

(51) Int. Cl.
| | |
|---|---|
| H01L 21/00 | (2006.01) |
| H01L 21/56 | (2006.01) |
| H01L 23/14 | (2006.01) |
| H01L 23/538 | (2006.01) |
| H01L 21/78 | (2006.01) |
| H01L 23/498 | (2006.01) |
| H01L 21/02 | (2006.01) |

(52) U.S. Cl.
CPC ............... *H01L 21/56* (2013.01); *H01L 21/78* (2013.01); *H01L 23/142* (2013.01); *H01L 23/49827* (2013.01); *H01L 23/5389* (2013.01); *H01L 21/02107* (2013.01); *H01L 21/02109* (2013.01); *H01L 21/02225* (2013.01); *H01L 21/02318* (2013.01); *H01L 2924/0002* (2013.01)

(58) Field of Classification Search
CPC ..................................................... H01L 23/481
See application file for complete search history.

(56) References Cited

U.S. PATENT DOCUMENTS

2010/0025829 A1* 2/2010 Mengel ................. H01L 21/563
                                                              257/676
2011/0198743 A1* 8/2011 Nikitin .................... H01L 24/80
                                                              257/690

FOREIGN PATENT DOCUMENTS

EP              1478023 A1    11/2004

* cited by examiner

*Primary Examiner* — William Harriston
(74) *Attorney, Agent, or Firm* — Seed Intellectual Property Law Group PLLC

(57) ABSTRACT

A method for making a set of electronic devices is proposed. The method comprises the steps of providing a support comprising a base plate of electrically conductive material, fixing a set of chips of semiconductor material onto respective portions of the base plate, each chip having a first main surface with at least one first conduction terminal and a second main surface opposite the first main surface with at least one second conduction terminal electrically connected to the base plate, fixing an insulating tape of electrically insulating material comprising a plurality of through-holes to the main surface of each chip, the insulating tape protruding from the chips over a further portion of the base plate being not covered by the chips, and forming at least one first electrical contact to each first terminal of the chips through a first set of the through-holes exposing at least in part said first terminal, and at least one second electrical contact to the base plate through a second set of the through-holes exposing at least in part the further portion of the base plate.

16 Claims, 2 Drawing Sheets

FLIP-CHIP ELECTRONIC DEVICE AND PRODUCTION METHOD THEREOF

BACKGROUND

1. Technical Field

One or more embodiments of the present disclosure generally relates to the electronics field. In particular, the disclosure relates to connections of electronic devices.

2. Description of the Related Art

Each electronic device typically comprises one or more chips (for example, of semiconductor material), each one of which is provided with terminals for its connection to external circuits.

According to a typical connection mode, the chip is encapsulated within an insulating body having exposed leads for connection to a printed circuit board (PCB); the terminals of the chip are connected to respective leads by bonding wires.

However, the bonding wires involve an increase of size of the electronic device, and introduce resistive, capacitive and/or inductive parasitisms (having values being not predictable a priori) that impair performance thereof. Furthermore, the bonding wires involve long production processes (as they should be welded serially) and burdensome designs (configurations avoiding short-circuits between the bonding wires).

According to another connection mode (called "flip chip"), the chip is mounted upside down onto the PCB (or onto a chip carrier), so that its terminals contact the PCB directly (or by conductive balls of the chip carrier, connected to the terminals of the chip through via-holes thereof). In this way, the absence of the bonding wires allows obtaining electronic devices having small size and high performance.

However, the "flip chip" connection mode has drawbacks that preclude a wider use thereof, e.g., in case of a chip having terminals exposed on different surfaces of it (such as in electronic devices for power applications). In such case, in fact, before mounting the chip onto the PCB (or onto the chip carrier), it is necessary to carry out operations for making all its terminals accessible by a same side thereof.

For example, in case of a vertical-structure power transistor with a lower terminal (drain terminal) and two upper terminals (gate and source terminals), such operations comprise: fixing of the chip onto an electrically conductive base plate (with the drain terminal in contact with the base plate), forming of an insulating layer onto the chip and onto a portion of the base plate being not covered by the chip (for example, by electrolytic growth), making of the through-holes through the insulating layer for exposing the gate terminal, the source terminal and the portion of the base plate (for example, by etching), and metalling of the through-holes for contacting the gate terminal, the source terminal and the base plate (and hence the drain terminal). In this way, the gate and source terminals and the drain terminal are accessible, through respective contacts, on a same surface, thus making it possible the flip chip connection onto the PCB (or onto the chip carrier) through them. However, such operations involve an excessive duration of the production process of the electronic device, and involve practical and constructive inefficiencies as well.

In particular, the making of the through-holes is typically performed in several phases (as they have different depths), and it exposes the chip to perforations risks.

BRIEF SUMMARY

In its general terms, according to one or more embodiments of the present disclosure there is provided an electronic device that includes an insulating layer with preformed through-holes.

According to an embodiment of the present disclosure there is provided a method for making a set of electronic devices, wherein a set of chips of semiconductor material is fixed onto a conductive base plate, an insulating tape comprising a plurality of through-holes is fixed onto each chip, and at least one first electrical contact to each chip is formed through a first set of the through-holes and at least one second electrical contact to the base plate is formed through a second set of the through-holes.

A further aspect of the solution according to an embodiment of the present disclosure proposes a corresponding electronic device.

A further aspect of the solution according to an embodiment of the present disclosure proposes a system comprising at least one of such electronic devices.

BRIEF DESCRIPTION OF THE SEVERAL VIEWS OF THE DRAWINGS

One or more embodiments of the disclosure, as well as further features and the advantages thereof, will be best understood with reference to the following detailed description, given purely by way of a non-restrictive indication, to be read in conjunction with the accompanying drawings (wherein, for the sake of simplicity, corresponding elements are denoted with equal or similar references, and their explanation is not repeated, and the name of each entity is generally used for denoting both type and attributes thereof—such as value, content and representation). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
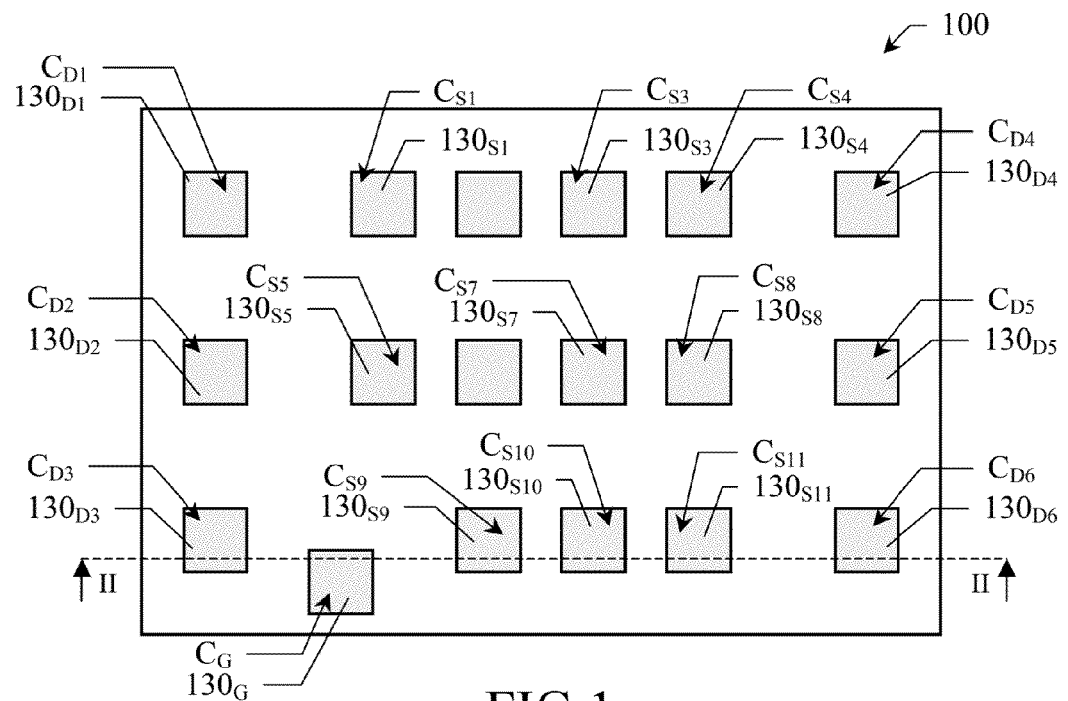
FIG. 1 shows a plan view of an electronic device according to an embodiment of the present disclosure.

Considering in particular FIG. 1, it shows a plan view of an electronic device 100 according to an embodiment of the present disclosure. For the sake of description simplicity, such figure will be discussed jointly with FIG. 2, which shows a sectional view of a part of such electronic device 100 along the section plane II-II of FIG. 1.

The electronic device 100 comprises a chip 105 of semiconductor material (or more of them) on which, for example, a vertical structure MOS power transistor is integrated. The chip 105 has a conduction terminal $T_D$ (e.g., a drain terminal of the power transistor) extending on a whole (rear) surface $110_L$ of the chip 105; another conduction terminal $T_S$ (e.g., a source terminal of the power transistor) is provided on another (front) surface $110_U$ of the chip 105 opposite the surface $110_L$, together with a control terminal $T_G$ (e.g., a gate terminal of the power transistor). As will be explained shortly, the terminals $T_D$, $T_S$, $T_G$ are all accessible, without bonding wires, from a same side of the electronic device 100 (so as to allow its mounting on a PCB, or on a chip carrier—both not shown—in "flip chip" mode). In particular, the electronic device 100 comprises (exposed on its front surface) one or more source contacts $C_{Si}$ (i=1, 2, . . . N, with N=11 in the example at issue), one or more drain contacts $C_{Dj}$ (j=1, 2, . . .

M, with M=6 in the example at issue), and one or more gate contacts $C_G$ (one in the example at issue), which are electrically connected to the terminals $T_S$, $T_D$, $T_G$, respectively.

Figure 2:
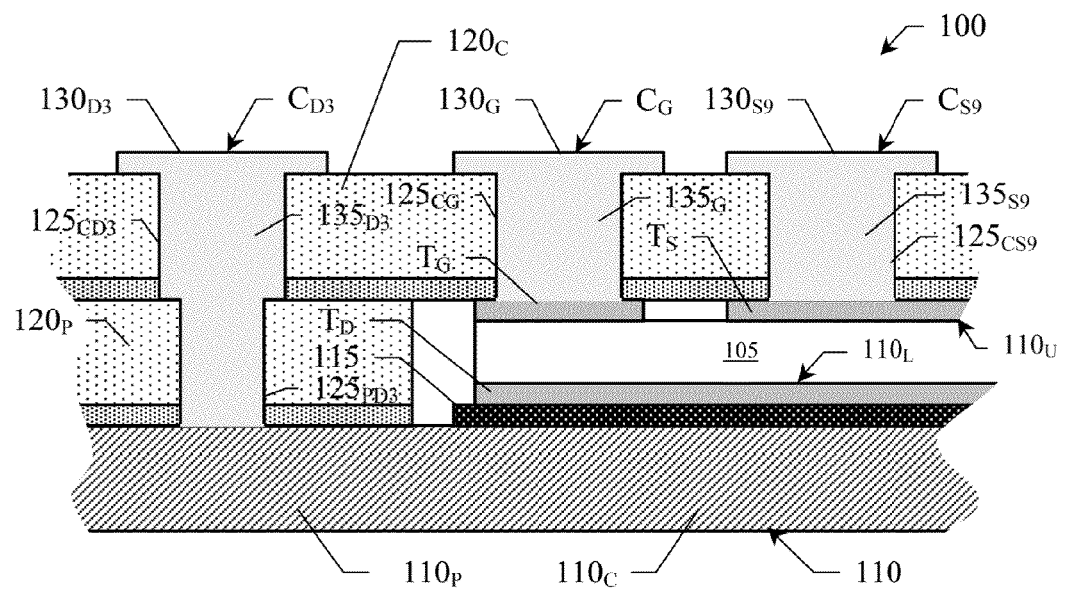
FIG. 2 shows a sectional view of a part of such electronic device along the section plane II-II of FIG. 1, and FIGS. 3A-3C schematically show some significant steps of the production process of the electronic device of FIG. 1 according to an embodiment of the present disclosure.

The chip 105 is fixed to a portion $110_C$ of a base plate 110 of electrically conductive material (e.g., copper)—which, only partly visible in FIG. 2, is used to form several identical electronic devices concurrently. In particular, the surface $110_L$ of the chip 105 is directed towards the portion $110_C$, with the terminal $T_D$ electrically connected to it (for example, by interposition of a soldering conductive layer 115).

The electronic device 100 comprises a tape $120_C$ of electrically insulating material (e.g., polyamide), which is provided with a plurality of preformed through-holes. The tape $120_C$ is fixed onto the surface $110_U$ of the chip 105 and protrudes from it over a further (e.g., perimeter) portion $110_P$ of the base plate 110 being not covered by the chip 105. The through-holes of the tape $120_C$ comprise one or more through-holes $125_{CSi}$ (such as the through-hole $125_{CS9}$ visible in FIG. 2) each one exposing a respective region of the terminal $T_S$ (for making a corresponding contact $C_{Si}$), one or more through-holes (such as the through-hole $125_{CG}$ visible in FIG. 2) each one exposing a respective region of the terminal $T_G$, and one or more through-holes $125_{CDj}$ (such as the through-hole $125_{CD3}$ visible in FIG. 2) each one exposing a respective region of the portion $110_P$.

Each contact $C_{Si}$, $C_{Dj}$, $C_G$ comprises a pad $130_{Si}$, $130_{Dj}$, $130_G$ on the front surface of the electronic device 100 for contacting the PCB (or the chip carrier), and a vertical connection element $135_{Si}$, $135_{CDj}$, $135_G$ (only the elements $135_{S9}$, $135_{D3}$, $135_G$ being visible in FIG. 2), or more of them, for electrically connecting the pad $130_{Si}$, $130_{CDj}$, $130_G$ to the terminal $T_S$, $T_D$, $T_G$, respectively, through the corresponding through-holes $125_{CSi}$, $125_{CDj}$, $125C_G$ of the tape $120_C$.

Therefore, with respect to the known solutions, wherein the through-holes are made in an insulating layer (after its deposition), the present disclosure exploits a pre-perforated tape (e.g., already used for making other known products).

This involves a shorter production process, as etching operations for making the through-holes are not necessary. Moreover, the production process is more efficient, as the chip 105 is not subject to perforations and/or damage risks.

Preferably, the electronic device 100 comprises a further tape $120_P$ of electrically insulating material (e.g., again polyamide), which is provided with one or more further through-holes $125_{PDj}$ (only the through-hole $125_{PD3}$ visible in FIG. 2). The tape $120_P$ is fixed between the portion $110_P$ and the tape $120_C$ so that each one of the through-holes $125_{PDj}$ of the tape $120_P$ (or of a part of them) exposes a respective region of the portion $110_P$, and is coaxial with a respective through-hole $125_{CDj}$. In this way, each vertical connection $135_{Dj}$ is formed through the through-hole $125_{CDj}$ and the through-hole $125_{PDj}$ intercepted by it.

This allows obtaining an excellent mechanical stability, without any problem in the making of the (longer) through-holes for reaching the portion $110_P$, which are simply obtained by overlapping the tapes $120_C$ and $120_P$ and appropriately aligning them.

Advantageously, as illustrated in FIG. 2, the through-holes $125_{CSi}$, $125_{CDj}$, $125C_G$ have a greater width than the through holes $125_{PDj}$ (for example, with the radius of the through-holes $125_{CSi}$, $125_{CDj}$, $125C_G$ being greater than 0.1 times, preferably greater than 0.3 times, and even more preferably greater than 0.5 times the radius of the through-holes $125_{PDj}$). This feature allows simplifying the alignment of the tapes $120_P$, $120_C$ and/or making it more efficient. In fact, the greater width of the through-holes $125_{CDj}$ may allow completely intercepting the through-holes $125_{PDj}$ even in the presence of slight construction misalignments.

Figure 3A:
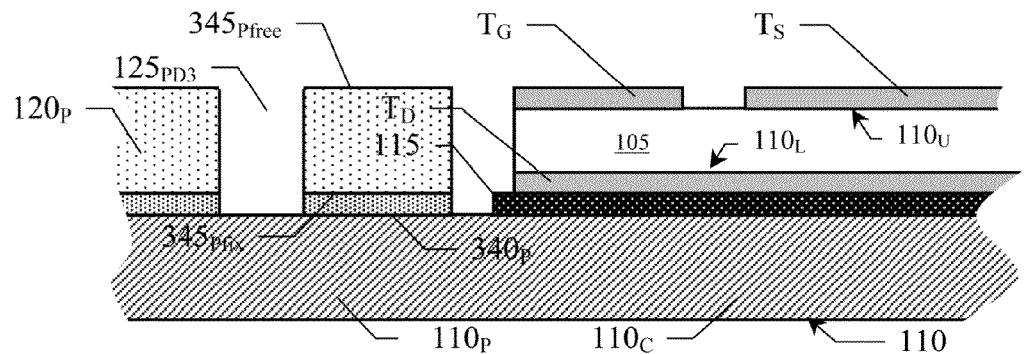
Figure 3B:
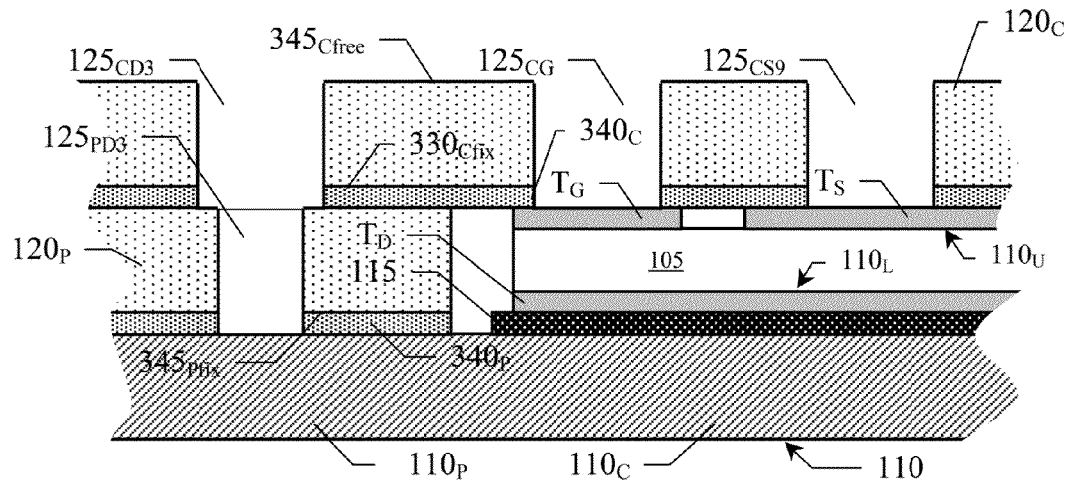
Figure 3C:
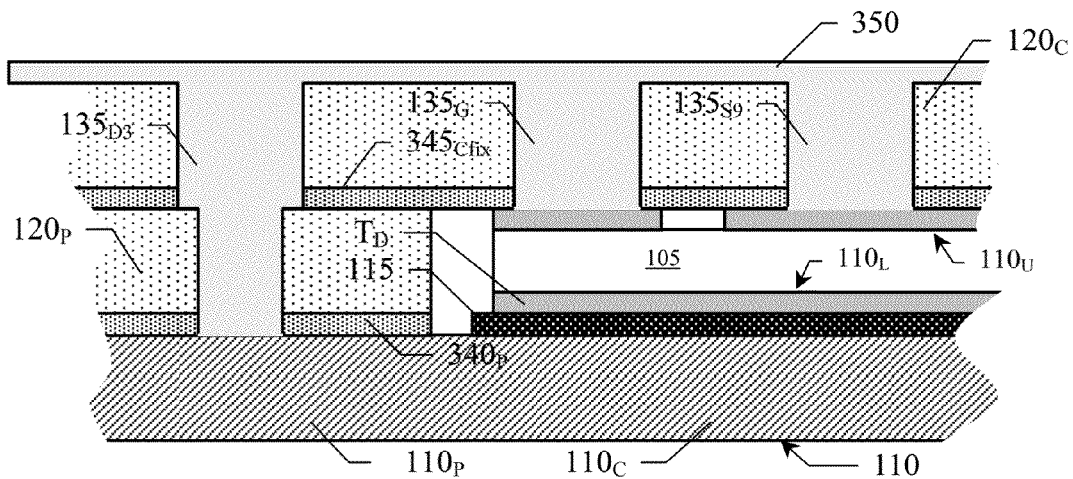

Some significant steps of the production process of the electronic device 100 according to an embodiment of the present disclosure are illustrated in FIGS. 3A-3C.

As above mentioned, the production process is performed at the level of a batch of completely identical electronic devices 100, which are made concurrently in large numbers and are separated at the end by a cutting operation (for the sake of description simplicity, however, in the following reference will be made to only one of such electronic devices).

Considering in particular FIG. 3A, the production process starts by fixing the chip 105 onto the portion $110_C$ of the base plate 110 and the tape $120_P$ onto the portion $110_P$; alternatively, the tape $120_P$ may be provided as part of a pre-assembled support together with the base plate 110 for the fixing of the chip 105 only.

The chip 105 is fixed onto the portion $110_C$ as usual, e.g., by the layer of soldering material 115. Instead, the tape $120_P$ is provided with a thermally activatable glue layer $340_P$ on a fixing surface thereof $345_{Pfix}$ facing the base plate 110. The fixing of the tape $120_P$ to the portion $110_P$ is achieved by positioning the tape $120_P$ onto the portion $110_P$, and subjecting it to a hot lamination process for reducing a thickness thereof (for example, by adapting it to the thickness of the chip 105). In this way, the relatively high temperature reached during the lamination process is sufficient for activating the glue layer $340_P$, and hence obtaining the adhesion of the tape $120_P$ to the portion $110_P$.

Turning now to FIG. 3B, the tape $120_C$ is fixed onto the surface $110_U$ of the chip 105 and onto a free surface $345_{Pfree}$ of the tape $120_P$ opposite the surface $345_{Pfix}$. The tape $120_C$ also has a further free surface $345_{Cfree}$ and a further fixing surface $345_{Cfix}$ opposite the surface $345_{Cfree}$, which is provided with a further thermally activatable glue layer $340_C$. Similarly to the previous case, the fixing is achieved by positioning the tape $120_C$ onto the surface $345_{Pfree}$ of the tape $120_P$ and onto the surface $110_U$ of the chip 105, and subjecting it to a hot lamination process that, at the same time, activates the glue layer $340_C$.

In this phase, the positioning of the tape $120_C$ is such as to allow the through-holes $125_{CDj}$ to intercept the through-holes $125_{PDj}$ of the tape $120_P$ (so as to expose the respective regions of the portion $110_P$), the through-holes $125_{CSi}$ to expose the respective regions of the terminal $T_S$, and the through-hole $125C_G$ to expose the respective region of the terminal $T_G$. Therefore, in the described embodiment, the total number of through-holes of the tape $120_C$ is equal to N+M+1 (but it may also be greater than such value, in which case through-holes will be provided that, if they do not expose useful regions of the chip or of the base plate 110, are unused). Similarly, the total number of through-holes in the tape $120_P$ may be even greater than M (in which case through-holes might be provided that, if they are not intercepted by the through-holes of the tape $120_C$, may be closed thus remaining unused).

At this point, the work piece so far obtained is subject to a curing process of the glue layers $340_C$, $340_P$, for example, by placing it within an apparatus with a controlled atmosphere for a predetermined time period.

Turning to FIG. 3C, an electroplating process is carried out for growing, by electrolysis, the material by which the base plate 110 is formed (copper, in the example at issue) into the through-holes $125_{PDj}$, into the through-holes $125_{CDj}$ intercepting the latter ones, onto the surface $345_{Cfree}$ of the tape $120_C$, into the through-holes $125_{CSj}$, $125C_G$ that expose regions of the terminals $T_S$, $T_G$, respectively, and possibly into the unused through-holes (if provided). At the end of such process, the elements $135_{Si}$, $135_{Dj}$, $135C_G$ are obtained and the surface $345_{Cfree}$ of the tape $120_C$ is covered by a copper layer 350.

Subsequently, a mask of photo-resist material, not shown in the figure, is provided onto the layer 350 via a photo-lithographic technique; portions of the layer 350 being not protected by the mask are etched—for example, by a dry etching operation. The result of such operation is shown in FIG. 2, with the definition of the pads $130_{Si}$, $130_{Dj}$, $130_G$ (and thus of the contacts $C_{Si}$, $C_{Dk}$, $C_G$)—with the possible unused through-holes in the tape $120_C$ (not shown in the figure) that are filled at the same level of the free surface thereof.

At this point, after the electronic devices 100 thus obtained have been appropriately completed according to specific requirements (for example, by coating the contacts $C_{Si}$, $C_{Dk}$, $C_G$ with one or more coating layers of anti-oxidants materials—steps being not shown), they are mechanically separated from each other in a known manner (for example, by mechanical sawing through the base plate 110 and the tapes $120_C$, $120_P$—steps being not shown).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the disclosure may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, ordinal qualifiers or the like are merely used as labels for distinguishing elements with the same name but do not connote any priority, precedence or order. Moreover, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, an embodiment of the present disclosure proposes a method for making a set of (one or more) electronic devices. The method comprises the following steps. A support comprising a base plate of electrically conductive material is provided. A set of chips of semiconductor material are fixed onto respective portions of the base plate; each chip has a first main surface with at least one first conduction terminal and a second main surface opposite the first main surface with at least one second conduction terminal electrically connected to the base plate. An insulating tape of electrically insulating material comprising a plurality of through-holes is fixed to the main surface of each chip; the insulating tape protrudes from the chips over a further portion of the base plate being not covered by the chips. At least one first electrical contact to each first terminal of the chips is formed through a first set of the through-holes exposing at least in part said first terminal, and at least one second electrical contact to the base plate is formed through a second set of the through-holes exposing at least in part the further portion of the base plate.

However, although in the present description explicit reference has been made to an electronic device having a single chip with integrated a vertical structure MOS power transistor, this should not be understood restrictively; in this regard, number and type of chips may be whatever one, as well as number and type of electronic components integrated on each one of them. In particular, the same principles may be extended to any application that requires making the terminals of the chip accessible by a same side of the electronic device (without bonding wires).

The number of through-holes is not limitative, and it does not necessarily coincide with the number of electrical contacts. In this respect, it is possible to envisage that the insulating tape covers a large number of through-holes, some of which, as exposing no useful region, may be redundant (and hence unused, or used to implement specific technical solutions).

Moreover, the number of contacts is not limitative. Each contact may have one or more pads, and each pad may be associated with more vertical connection elements (i.e., through-holes). In addition, the size and distribution of the contacts may be chosen on the basis of electrical and mechanical considerations. For example, the gate contact may comprise, in addition to the pad, conductive fingers distributed on the upper surface of the electronic device, so as to avoid non-uniform distributions of the electrical signals.

According to an embodiment of the present disclosure, the step of providing a support comprises providing the support with a further insulating tape of electrically insulating material comprising a set of further through-holes fixed on the further portion of the base plate; the insulating tape protruding from the chips is fixed onto the further insulating tape and said at least one second electrical contact is formed through a further set of the further through-holes exposing the further portion of the base plate.

However, the further insulating tape may also not be provided, if not necessary. For example, it is possible to envisage an implementation wherein the chip, completely inserted within a recess of the base plate, is at the same level of the latter; in such case, therefore, the insulating tape may rest directly on the main surface of the chip and on the further portion of the base plate.

According to an embodiment of the present disclosure, the step of providing the support with a further insulating tape comprises fixing the further insulating tape onto the further portion of the base plate.

Anyway, such step may also be omitted in a basic implementation. Moreover, in case of height difference between the further insulating tape and the chip (for example, in case the further insulating tape has a thickness lower than the chip), the insulating tape may also be not in contact with the further insulating tape (or intermediate layers may be provided for compensating the height difference).

According to an embodiment of the present disclosure, the through-holes have a width greater than the additional through-holes; each through-hole of the second set of the through-holes is substantially coaxial with a corresponding further through-hole of the further set of the further through-holes.

However, nothing prevents the further through-holes from having a width greater than or equal to that of the through-holes. Furthermore, in order to compensate for structural differences between the insulating tape and the further insulating tape (for example, differences in the distribution of the respective through-holes), the alignment of the through holes may also be not coaxial.

According to an embodiment of the present disclosure, the insulating tape comprises a fixing surface for the fixing to the first surface of each chip and to the further insulating tape, and a free surface opposite the fixing surface. The step of forming at least one first electrical contact and at least one second electrical contact comprises growing the electrically conductive material of the base plate in the further set of the further through-holes, in the second set of the through-holes, on the free surface of the insulating tape and in the first set of the through-holes, and shaping the grown electrically conductive material for obtaining said at least one first electrical contact and said at least one second electrical contact.

Anyway, nothing prevents making the electrical contacts of a material different from that of the base plate. In such case, therefore, it is also possible to carry out deposition operations (e.g., chemical vapor deposition or physical vapor deposition), instead of growth operations.

According to an embodiment of the present disclosure, the step of growing the electrically conductive material comprises growing the electrically conductive material in all the first through-holes.

Anyway, in the presence of redundant through-holes, they may be excluded during the growth (or deposition) process— for example, by using appropriate masks.

According to an embodiment of the present disclosure, the further insulating tape comprises a further fixing surface for the fixing on the further portion of the base plate, and a further free surface opposite the further fixing surface for the fixing to the fixing surface of the insulating tape. The fixing surface of the insulating tape and the further fixing surface of the further insulating tape comprise an electrically conductive and thermally activatable glue layer and further glue layer, respectively: the step of fixing the insulating tape and the step of fixing the further insulating tape comprise heating the glue layer and the further glue layer.

Such step may be carried out after the positioning of the further insulating tape and/or after the positioning of the insulating tape. Moreover, the heating of the glue layer and of the further glue layer may also be exploited for heating the soldering layer; in this way, the fixing of the chip may be performed together with the fixing of the insulating tape and/or of the further insulating tape.

Moreover, such step may be omitted in a basic implementation. In this respect, the glue layers may not be provided, or they may be replaced by any other type of adhesive suitable for the purpose. Anyway, the glue layer and the further glue layer may also not be provided together with the insulating tape and the further insulating tape, respectively.

According to an embodiment of the present disclosure, the step of fixing the insulating tape and the step of fixing the further insulating tape comprise performing a hot lamination process.

Anyway, the lamination process may also be omitted in a basic implementation. In addition, the lamination process, if carried out, may be performed in one or more phases. For example, it is possible to perform a first lamination process after, or during, the fixing of the further insulating tape (if provided) and a second lamination process after, or during, the fixing of the insulating tape.

According to an embodiment of the present disclosure, the method further comprises the step of cutting the base plate and the insulating tape for obtaining a plurality of said electronic devices each one comprising at least one of said chips with the respective first contacts and second contacts.

Anyway, based on specific design requirements, such step may be performed at any advancement of the production process. In such case, therefore, the steps of the method previously described with reference to a plurality of electronic devices may be performed individually on each cut work piece for obtaining the corresponding electronic device. Anyway, the same method may also be used for making a single electronic device on the whole base plate.

In general, the solution according to an embodiment of the disclosure lends itself to be implemented through an equivalent method (by using similar steps, removing some non-essential steps, or adding additional optional steps); moreover, the steps may be performed in a different order, in parallel or overlapped (at least in part).

An embodiment of the present disclosure proposes an electronic device comprising a support comprising a base plate of electrically conductive material, and a set of (one or more) chips of semiconductor material fixed on a respective portion of the base plate; each chip has a first main surface with at least one first conduction terminal and a second main surface opposite the first main surface with at least one second conduction terminal electrically connected to the base plate. The electronic device further comprises an insulating tape of electrically insulating material comprising a plurality of through-holes fixed to the main surface of each chip, with the insulating tape that protrudes from the chips over a further portion of the base plate being not covered by the chips. The electronic device comprises at least one first electrical contact to each first terminal of the chips through a first set of the through-holes exposing at least in part said first terminal, and at least one second electrical contact to the base plate through a second set of the through-holes exposing at least in part the further portion of the base plate.

Anyway, similar considerations apply if the electronic device has a different structure or comprises equivalent components. In any case, every component thereof may be separated into several elements, or two or more components may be combined into a single element; in addition, each component may be replicated to support the execution of the corresponding operations in parallel. It should also be noted that (unless stated otherwise) any interaction between different components generally does not need be continuous, and it may be direct or indirect via one or more intermediaries.

An embodiment of the present disclosure proposes a system (for example, a mobile phone, a computer, and the like) comprising one or more of such electronic devices.

However, the electronic device may be used in any other application, and it may obviously be made and put on the market as stand-alone product.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for making a plurality of electronic devices, the method comprising:

fixing a plurality of chips of semiconductor material onto respective portions of a base plate of electrically conductive material, each chip having a first surface with a first conduction terminal and a second surface opposite the first surface that is coupled to the base plate;

fixing a first insulating tape of electrically insulating material to the first surface of each chip, the first insulating tape including a first set of one or more through-holes that expose portions of the first surface of the chips, the first insulating tape over sections of the base plate that are not covered by the chips and including a second set of one or more through-holes exposing portions of the sections of the base plate, wherein the first and second sets of the one or more through-holes are open at completion of the fixing step; and after the fixing step, forming a first electrical contact on the first conductive terminal of the chips through the first set of the through-holes and a second electrical contact on the base plate through the second set of the through-holes.

2. The method according to claim 1, further comprising:
providing a second insulating tape of electrically insulating material that includes a third set of one or more through-holes on the sections of the base plate prior to fixing the first insulating tape, the third set of through-holes of the second insulating tape being aligned with the second set of through-holes of the first insulating tape; and
wherein forming the second electrical contact on the base plate comprises forming the second electrical contact through the second set of through-holes of the first insulating tape and the third set of through-holes of the second insulating tape.

3. The method according to claim 2, wherein providing the second insulating tape that includes the third set of through-holes on the sections of the base plate comprises:
fixing the second insulating tape onto the sections of the base plate.

4. A method according comprising:
fixing a plurality of chips of semiconductor material onto respective portions of a base plate of electrically conductive material, each chip having a first surface with a first conduction terminal and a second surface opposite the first surface that is coupled to the base plate;
fixing a first insulating tape of electrically insulating material to the first surface of each chip, the first insulating tape including a first set of one or more through-holes that expose portions of the first surface of the chips, the first insulating tape over sections of the base plate that are not covered by the chips and including a second set of one or more through-holes exposing portions of the sections of the base plate;
forming a first electrical contact on the first conductive terminal of the chips through the first set of the through-holes and a second electrical contact on the base plate through the second set of the through-holes; and
providing a second insulating tape of electrically insulating material that includes a third set of one or more through-holes on the sections of the base plate prior to fixing the first insulating tape, the third set of through-holes of the second insulating tape being aligned with the second set of through-holes of the first insulating tape, wherein forming the second electrical contact on the base plate comprises forming the second electrical contact through the second set of through-holes of the first insulating tape and the third set of through-holes of the second insulating tape, wherein the first set of and second set of through-holes of the first insulating material have a width greater than the third set of through-holes of the second insulating material.

5. The method according to claim 4, wherein the first insulating tape comprises a first fixing surface for fixing to the first surface of each chip and to the second insulating tape, and a first free surface opposite the first fixing surface, and wherein forming the first electrical contact and the second electrical contact comprises:
growing the electrically conductive material of the base plate in the first and second set of through-holes of first insulating tape, in the third set of through-holes in the second insulating tape, and on the first free surface of the first insulating tape; and
shaping the grown electrically conductive material for obtaining said first electrical contact and said second electrical contact.

6. The method according to claim 5, wherein growing the electrically conductive material comprises:
growing the electrically conductive material in all of the through-holes.

7. The method according to claim 5, wherein the second insulating tape comprises a second fixing surface for the fixing on the section of the base plate, and a second free surface opposite the second fixing surface for the fixing to the first fixing surface of the first insulating tape, and
wherein:
the first fixing surface of the first insulating tape and the second fixing surface of the second insulating tape comprise an electrically conductive and thermally activatable first glue layer and second glue layer, respectively; and
fixing the first insulating tape and fixing the second insulating tape comprises heating the first glue layer and the second glue layer.

8. The method according to claim 7, wherein fixing the first insulating tape and fixing the second insulating tape comprises performing a lamination process.

9. The method according to claim 1, further comprising cutting the base plate and the insulating tape for obtaining a plurality of said electronic devices, each comprising at least one of said chips, said first electrical contact, and said second electrical contact.

10. An electronic device comprising:
a base plate of electrically conductive material;
a plurality of chips of semiconductor material, each chip fixed on a respective portion of the base plate and having a first surface with a first conduction terminal and a second surface opposite the first surface coupled to the base plate;
a first insulating tape of electrically insulating material including a first set of one or more through-holes fixed to the surface of each chip, the first insulating tape further located over sections of the base plate not covered by the chips and including a second set of one or more through-holes;
first electrical contacts coupled to first conductive terminals of the chips, respectively, through the first set of through-holes, and a second electrical contact coupled to the base plate through the second set of the through-holes; and
a second insulating tape of electrically insulating material comprising a third set of one or more through-holes fixed to the base plate between the plurality of chips, wherein the second set of through-holes of the first insulating tape are aligned with the third set of through-holes of the second insulating tape and the second electrical contact is coupled to the base plate through the second through-holes of the first insulating tape and the third through-holes of the second insulating tape, wherein the second set of through-holes of the first insulating tape have widths that are greater than the widths of the third set of through-holes of the second insulating tape.

11. The electronic device according to claim 10, wherein the first set of and second set of through-holes of the first insulating tape have the same dimensions.

12. A method comprising:
placing a first surface of a plurality of semiconductor devices on a base plate of conductive material, each of the semiconductor devices having a opposite second surface that includes a conductive terminal;
forming a plurality of through-holes in a first insulating tape;
adhering the first insulating tape to the plurality of semiconductor devices, a first set of one or more through-holes being aligned with the conductive terminal on the semiconductor devices and a second set of one or more through-holes being located over the first surface of the base plate, the first and second set of one or more through-holes remaining open upon completion of adhering the first insulating tape to the plurality of semiconductor devices; and
after completion of adhering, forming first electrical contacts on the second surface of each semiconductor device through the first portion of the plurality of through-holes and forming second electrical contacts on the base plate through the second portion of plurality of through-holes.

13. A method comprising:
placing a first surface of a plurality of semiconductor devices on a base plate of conductive material, each of the semiconductor devices having a opposite second surface that includes a conductive terminal;
forming a plurality of through-holes in a first insulating tape;
adhering the first insulating tape to the plurality of semiconductor devices, a first set of one or more through-holes being aligned with the conductive terminal on the semiconductor devices and a second set of one or more through-holes being located over the first surface of the base plate;
forming first electrical contacts on the second surface of each semiconductor device through the first portion of the plurality of through-holes and forming second electrical contacts on the base plate through the second portion of plurality of through-holes;
forming a third set of one or more through-holes in a second insulating tape; and
adhering the second insulating tape to the plate of conductive material, the second insulating tape being located between the semiconductor devices and under portions of the first insulating tape.

14. The method according to claim 13, wherein the third set of through-holes in the second insulating tape are aligned with the second set of through-holes in the first insulating tape.

15. The method according to claim 14, wherein the plurality of through-holes in the first insulating tape have a greater width than the third set of through holes in the second insulating tape.

16. The method according to claim 12, wherein forming a second electrical contacts on the surface of the plate comprises growing the second electrical contacts on the surface of the plate through the first set of through-holes.

* * * * *